(12) United States Patent
Matousek et al.

(10) Patent No.: US 10,164,592 B1
(45) Date of Patent: Dec. 25, 2018

(54) INDIVIDUALLY PROGRAMMABLE PREAMPLIFIER

(71) Applicant: Seagate Technology LLC, Cupertino, CA (US)

(72) Inventors: Robert Matousek, Berthoud, CO (US); Todd Michael Lammers, Lafayette, CO (US); Thomas Lee Schick, Arvada, CO (US)

(73) Assignee: Seagate Technology LLC, Cupertino, CA (US)

( * ) Notice: Subject to any disclaimer, the term of this patent is extended or adjusted under 35 U.S.C. 154(b) by 105 days.

(21) Appl. No.: 14/833,883

(22) Filed: Aug. 24, 2015

(51) Int. Cl.
 - *H03F 3/68* (2006.01)
 - *G11B 5/09* (2006.01)
 - *G11B 5/012* (2006.01)
 - *G11B 20/10* (2006.01)

(52) U.S. Cl.
 CPC .......... *H03F 3/68* (2013.01); *G11B 5/012* (2013.01); *G11B 20/10027* (2013.01); *G11B 20/10046* (2013.01)

(58) Field of Classification Search
 CPC .......... H03F 3/68; G11B 7/0941; G11B 5/012
 USPC ............. 360/46, 67–68; 369/59.14–59.15, 369/47.25–47.2; 386/343, 344
 See application file for complete search history.

(56) References Cited

U.S. PATENT DOCUMENTS

| | | | |
|---|---|---|---|
| 4,383,276 A * | 5/1983 | Makino | G11B 13/00 386/314 |
| 5,986,841 A | 11/1999 | Sorenson | |
| 6,400,520 B1 | 6/2002 | Stoutenburgh et al. | |
| 6,563,657 B1 | 5/2003 | Serrano et al. | |
| 8,139,301 B1 | 3/2012 | Li et al. | |
| 8,570,681 B2 | 10/2013 | Ho | |
| 2005/0094300 A1* | 5/2005 | Yano | G11B 5/012 360/31 |
| 2009/0141386 A1* | 6/2009 | Miura | G11B 5/09 360/46 |
| 2013/0128375 A1* | 5/2013 | Livshitz | G11B 5/02 360/48 |

FOREIGN PATENT DOCUMENTS

WO 0016337 3/2000

* cited by examiner

*Primary Examiner* — Khanh V Nguyen
*Assistant Examiner* — Khiem Nguyen
(74) *Attorney, Agent, or Firm* — Cesari & Reed, LLP; Kirk A. Cesari; Christian Best

(57) ABSTRACT

A preamplifier may have a freeze bit that when set, puts the preamplifier in a static state, which prevents the preamplifier from implementing subsequent programming commands. The freeze state may continue until an unfreeze bit is programmed. In a multiple preamplifier system, preamplifiers can be differently and individually configured over a single interface. Preamplifiers may be released from the static state (frozen) by either programming the unfreeze bit (which can release all of the preamps) or by programming the freeze bit to a "0" state (releases the individual preamp). An inversion control circuit can allow inversion of a control signal to a preamplifier. The inversion control circuit may be enabled and disabled based on a physical conductive connection to a logic high voltage or a logic low voltage. One or more programmable control lines can determine whether the inversion function is activated when the inversion control circuit is enabled.

20 Claims, 5 Drawing Sheets

INDIVIDUALLY PROGRAMMABLE PREAMPLIFIER

SUMMARY

An apparatus may include a first preamplifier having a first set of bits including a first freeze bit that when set causes the first preamplifier to enter a static state that prevents one or more other bits of the first set of bits from being changed when subsequent commands are received at the first preamplifier.

A system may include a first preamplifier having a first set of bits including a first freeze bit that when set causes the first preamplifier to enter a static state that prevents one or more other bits of the first set of bits from being changed when subsequent commands are received at the first preamplifier and a second preamplifier having a second set of bits. The system may also include an interface bus coupled to the first preamplifier and the second preamplifier, the interface bus configured to deliver a bit programming command to both the first preamplifier and the second preamplifier.

Further, a memory device can store instructions, that when executed cause a control circuit to: send a freeze command to a first amplifier, the freeze command configured to program a freeze bit to a first setting that causes the first amplifier to enter a static state to prevent other programmable bits of the first amplifier from being changed when subsequent commands are received at the first amplifier.

DETAILED DESCRIPTION

In the following detailed description of the embodiments, reference is made to the accompanying drawings which form a part hereof, and which are shown by way of illustrations. Features of the various described embodiments can be combined, other embodiments may be utilized, and structural changes may be made without departing from the scope of the present disclosure. Features of the various embodiments and examples herein can be combined, exchanged, or removed.

In accordance with various embodiments, the methods and functions described herein may be implemented as one or more software programs or firmware running on a computer processor or controller. In accordance with various embodiments, the methods and functions described herein may be implemented as one or more command instruction sets that can be executed by a logic device, such as a controller, processor, or programmable gate array. For example, a command may implemented via a control bus with control lines that can be set to a logic high or a logic low. Dedicated hardware implementations including, but not limited to, application specific integrated circuits, programmable logic arrays, and other hardware devices can likewise be constructed to implement the methods and functions described herein. Further, the methods and functions described herein may be implemented as a device, such as a computer readable storage medium or memory device, including instructions that when executed cause a processor or other logic to perform the methods. For example, the instruction set(s) described herein may be implanted as a memory device storing instructions that when executed by control logic or a controller, cause such to perform a method or processes.

Figure 1:
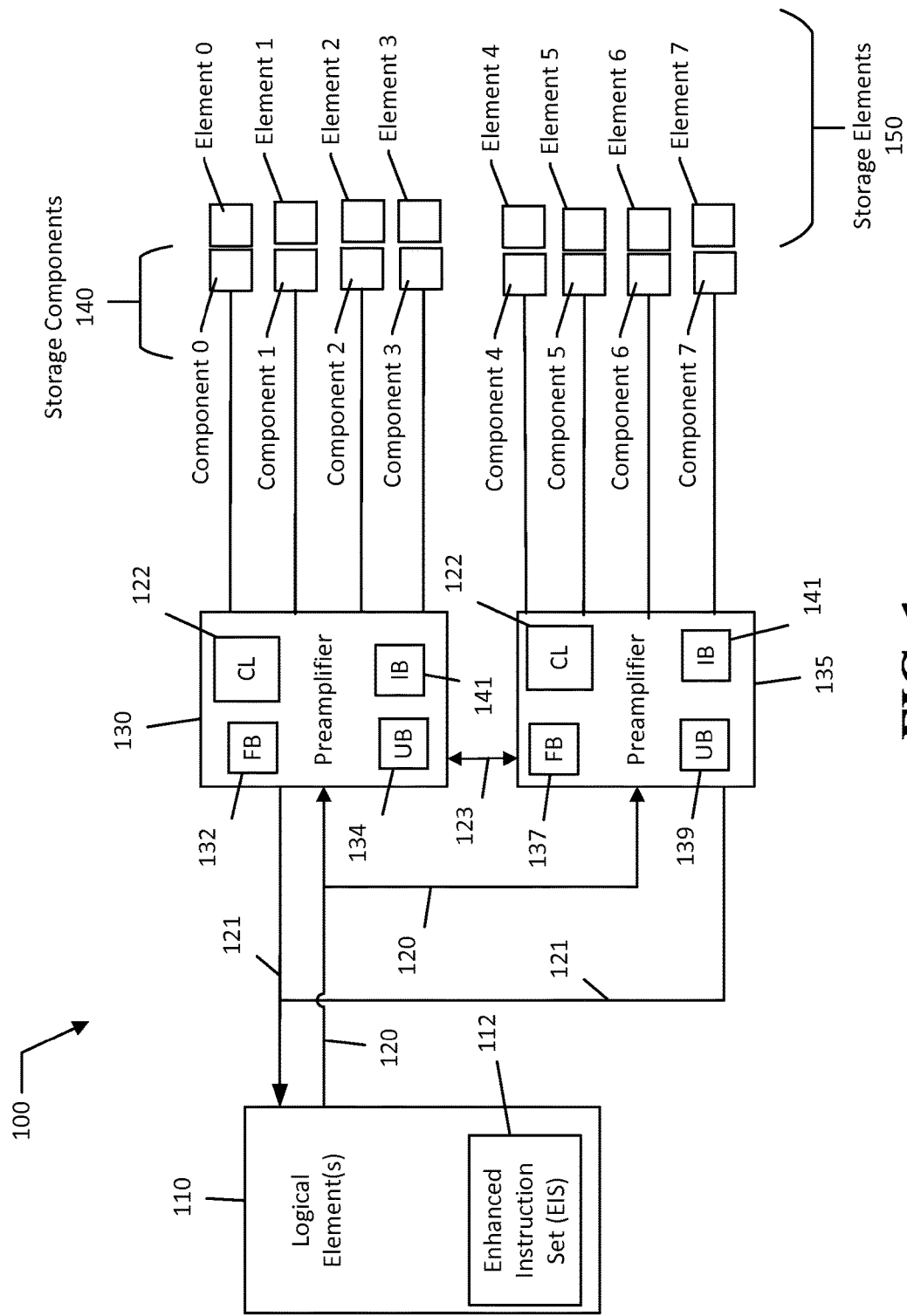
FIG. 1 is a block diagram of a system with multiple individually programmable preamplifiers, in accordance with certain embodiments of the present disclosure.

Referring to FIG. 1, a block diagram of a system 100 with multiple preamplifiers is shown, in accordance with certain embodiments of the present disclosure. The system 100 can include logical element(s) 110, a serial interface 120, and multiple preamplifiers, such as preamplifiers 130 and 135.

The logical element(s) 110 may include hardware logic, a controller, a processor, other control logic, or any combination thereof configured (i.e. adapted) to control multiple preamplifiers. The logical element(s) 110 can be coupled to the preamplifiers 130 and 135 over the serial interface 120 such that both the preamplifiers 130 and 135 receive commands or instructions from the logical element(s) 110 over the serial interface 120. Each preamplifier 130 and 135 may have a command logic 122, which can receive and execute commands sent to the preamplifiers 130 and 135 via the serial interface 120.

Certain embodiments of preamplifiers 130 and 135 may have an active state and an inactive state. A preamplifier may enter an active state when a component or element associated with or controlled by the preamplifier is selected. For example, a preamplifier may be coupled to an interface and when the preamplifier receives a command over the interface indicating a component controlled by the preamplifier, the preamplifier may enter an active state.

In certain embodiments, preamplifiers 130 and 135 may individually be responsive to a freeze command when the respective preamplifier is in an active state, and may not be responsive to a freeze command when the respective preamplifier is not in the active state. Thus, whether a preamplifier enters a static state in response to a freeze command may depend on whether the respective preamplifier is in an active state. Since both preamplifiers 130 and 135 are on the same serial interface bus 120, a register programming command(s) will configure all non-frozen preamplifiers. Freezing one or more of the multiple preamplifiers can allow for programming of any non-frozen preamplifiers differently than the frozen preamplifiers. This can allow for simultaneous use of multiple preamplifiers with different settings.

To provide for individualized configuration of preamplifiers 130 and 135 over the interface 120, the system 100 may include an enhanced instruction set 112. The enhanced instruction set 112 may allow for programming a selected one of the preamplifiers 130 and 135 to a static state (i.e. prevented from implementing further programming commands except for a command that takes the respective preamplifier out of the frozen state). For example, the preamplifier 130 may have registers to store bits 132 and 134 that may be set (e.g. configured or programmed) over the serial interface, which then affects a configuration or operation of the preamplifier 130. In certain embodiments, the functional bit settings of the preamplifiers 130 and 135 may include a freeze bit 132 or 137 responsive to a freeze command and an unfreeze bit 134 or 139 responsive to an unfreeze command. The preamplifier 130 may determine a value of the freeze bit ("FB") 132 stored in a register, and configure the preamplifier to operate in a static state in which the configuration (e.g. one or more bit settings in a register) of the preamplifier is static (i.e. cannot be changed until an unfreeze command is received).

A preamplifier bit settings, such as FB 132, FB 137, Unfreeze Bit ("UB") 134, or UB 139, may be set by sending a command over the interface 120 to the respective preamplifier, where the command changes a value of the one or more corresponding bits in a register. For example, a register may be implemented as a specific programmable memory address and may contain a bit that indicates to the respective preamplifier whether it is in a programmable state or a static state; a command that instructs the preamplifier to change the value of the specific bit in the register can toggle the preamplifier between the programmable state and the static state, such a command may be referred to as a freeze command (when initiating the static state) or an unfreeze command (when disabling the static state).

In some embodiments, a freeze command and an unfreeze command may program values to different (i.e. distinct) bits, such as FB 132 and UB 134, and the preamplifier 130 may monitor only the UB 134 when in the static state. Further, an unfreeze command and freeze command may be included in the enhanced instruction set accessible to the logical element 110, which may send such commands to the preamplifiers 130 and 135 over the serial interface 120 to control the programmable states of the preamplifiers 130 and 135. In certain embodiments, there may be only one bit that a preamplifier monitors to determine whether it is in a static state or programmable state; thus, flipping of the single bit in a register can switch the preamplifier from the programmable state to the static state and back again.

If a freeze bit of a preamplifier is programmed to implement a static state, the respective preamplifier will be placed in a static mode in which the preamplifier will not accept serial interface commands to its configuration bit settings, except for the freeze and unfreeze commands; thus, receiving further commands over the serial interface does not change its configuration, that is, the configuration of the preamplifier is "frozen" upon receiving a freeze command. Reception of an unfreeze command at a frozen preamplifier can "unfreeze" the respective amplifier by changing the state of the preamplifier to allow commands received at the preamplifier to change configuration bit settings other than the unfreeze bit.

Including a freeze command and an unfreeze command in an instruction set, such as enhanced instruction set 112, can allow a controller implementing the instructions set to differentially, individually, and independently configure multiple preamplifiers that are coupled to a common serial interface. While the examples provided herein are described mainly for two preamplifiers, any number of preamplifiers could be used. In some examples, subsequent to placing the preamplifier 130 in the static state while preamplifier 135 is not in the static state, preamplifier configuration commands can be sent over the serial interface 120 to the preamplifiers 130 and 135. Because the preamplifier 130 is in the static state, it will not be responsive to further preamplifier configuration commands to modify its configuration settings, while the preamplifier 135, which is not in the static state, will be configured by the further preamplifier configuration commands.

In some embodiments, such as data storage devices, preamplifiers 130 and 135 can be used to transmit data signals to data storage components 140 and data storage elements 150. The data storage components 140 and data storage elements 150 may be associated with discs, solid state memory, or other data storage. For example, the storage elements 150 may be magnetic data storage mediums and the storage components 140 may be read/write heads associated with the magnetic data storage mediums, where the preamplifiers 130 and 135 can be implemented to amplify data signals to allow data to be read from or written to a corresponding storage element 150. The system 100 can allow for the preamplifiers 130 and 135 to apply different settings while reading or writing data; for example, different preamplifier settings can be used while one storage component 140 is reading data and a different storage component 140 is writing data.

During operation of the system 100 in certain data storage embodiments, the logical element(s) 110 may send a command associated with a component of the storage components 140 over the serial interface 120 to the preamplifiers 130 and 135. In response to receiving the command, a specific preamplifier associated with the selected storage component (e.g. as indicated via the command) may enter an active state. Once in an active state, the preamplifier associated with the selected storage component can be responsive to a freeze command sent over the serial interface 120. A preamplifier not associated with the indicated or selected storage component may remain inactive despite receiving the command sent over the serial interface 120. The inactive preamplifier may not be responsive to the freeze command sent over the serial interface 120 because it is not active.

In certain embodiments, the preamplifier 130 may enter an active state when the preamplifiers 130 and 135 receive a command associated with the storage components 0 to 3. Similarly, the preamplifier 135 may enter an active state when the preamplifiers 130 and 135 receive a command associated with the storage components 4 to 7.

Similarly, if storage component 6 is associated with a command sent from the logical elements 110 over the serial interface 120 to the preamplifiers 130 and 135, the preamplifier 135 may become active and subsequent to becoming active is responsive to a freeze command. Thus, the preamplifier 130 and the preamplifier 135 may be differentially, independently, and individually configured, which can allow simultaneous reading from or writing to the storage elements 150.

In certain embodiments, system 100 may include a fault share line 123 coupled between the preamplifier 130 and the preamplifier 135. Further, some embodiments may include a dedicated fault line 121 coupled to the logic 110 to provide a fault indication to the logic 110. For example, when one of the preamplifiers 130 and 135 is active, the active preamplifier may drive the fault line 121. With both of the preamplifiers 130 and 135 active, the initially or first active preamplifier may drive the fault line 121, and the subsequently active preamplifier may send a fault status indication to the fault line 121 driving preamplifier via the fault share line 123. If one of the preamplifiers 130 and 135 are switched between an active state to an inactive state, the inactive preamplifier may use the fault share line 123 to report a fault to the active preamplifier which may be the preamplifier driving the fault line 121.

In some embodiments, to read data via one preamplifier at the same time as writing data via the other preamplifier, configuration settings (e.g. bit addresses of a register) in each preamplifier 130 and 135 may include a register to store an inversion bit 141 corresponding to the read/write control. The logic 110 can configure the setting of the inversion bits 141 during the configuration of the preamplifiers by configuration commands. When an inversion bit 141 is set (i.e. programmed with a specific value), the signal of the read/write control line will be inverted. The inversion bits 141 of the preamplifiers 130 and 135 may be individually set for each preamplifier per the methods herein, which, in some examples, can allow the preamplifiers 130 and 135 to be individually configured to read or write data responsive to the read/write control 430.

In some embodiments, a physical conductive connection (e.g. a solder bump to form a connection of a ball grid array to a substrate or trace or pad of a printed circuit board) on the preamplifier may be required to allow or deny an inversion bit from being effective. The physical conductive connection can provide a physical safety mechanism to disable the inversion feature. For example, the physical conductive connection can be made between a specific input (i.e. the inversion control line) of the preamplifier and whether the inversion bit feature was enabled could depend on whether the inversion control line was connected to a proper polarity, which, when enabled, would allow the inversion bit to allow polarity switching. Thus, before a preamplifier can use the polarity switching feature set, the physical conductive connection must be properly set to allow such. In some examples, such as discussed with respect to FIG. 5, the inversion control line can be connected to a logic high input (e.g. greater than 3 volts) for an allowance circuit to be activated, which allows the inversion bit to be utilized; whereas, if the inversion control line is connected to a logic low input (e.g. less than 1 volt), the allowance circuit is not activated and does not allow the inversion bit to be utilized.

Figure 2:
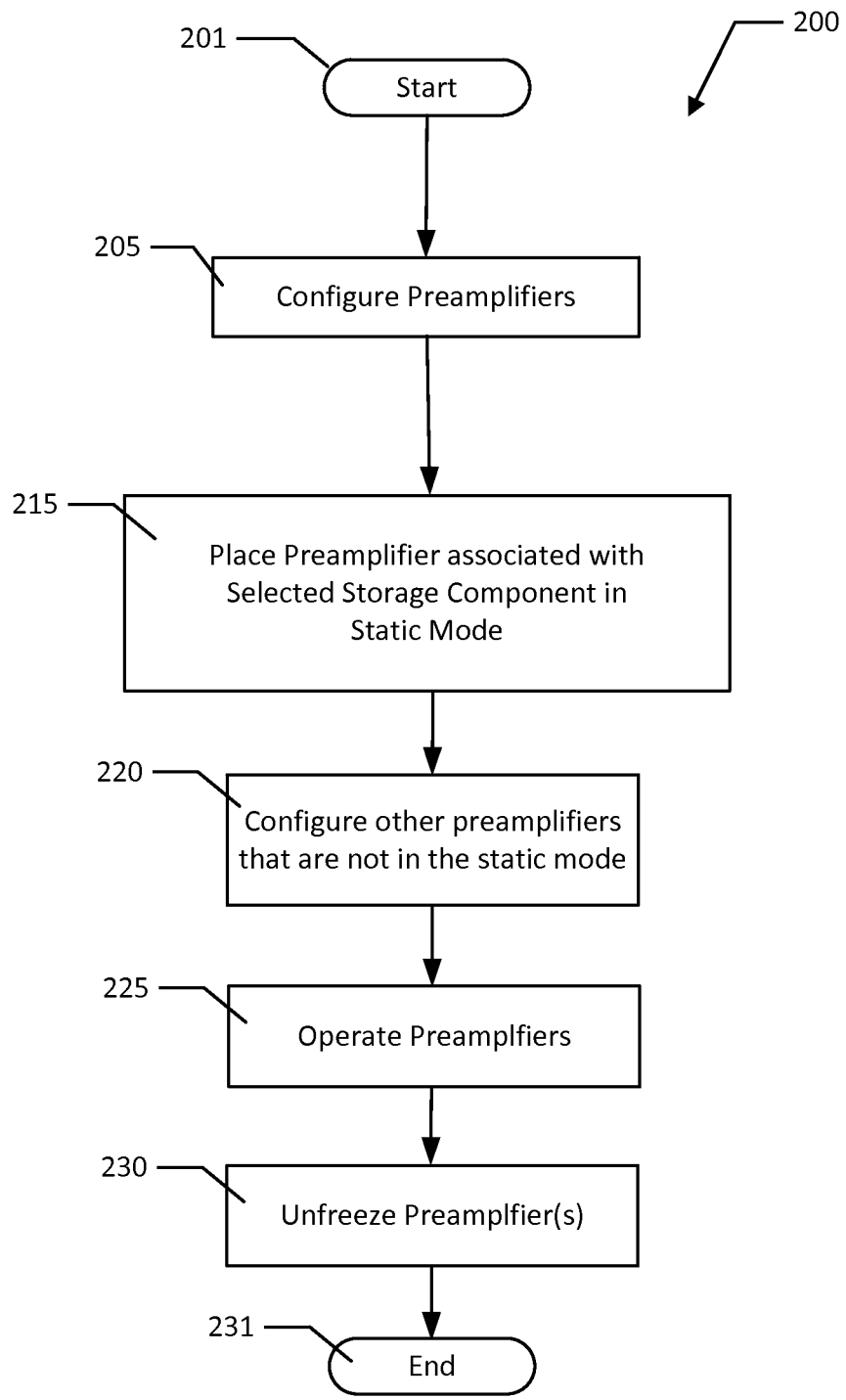
FIG. 2 is a flowchart of a method to configure an individually programmable preamplifier, in accordance with certain embodiments of the present disclosure.
Figure 3:
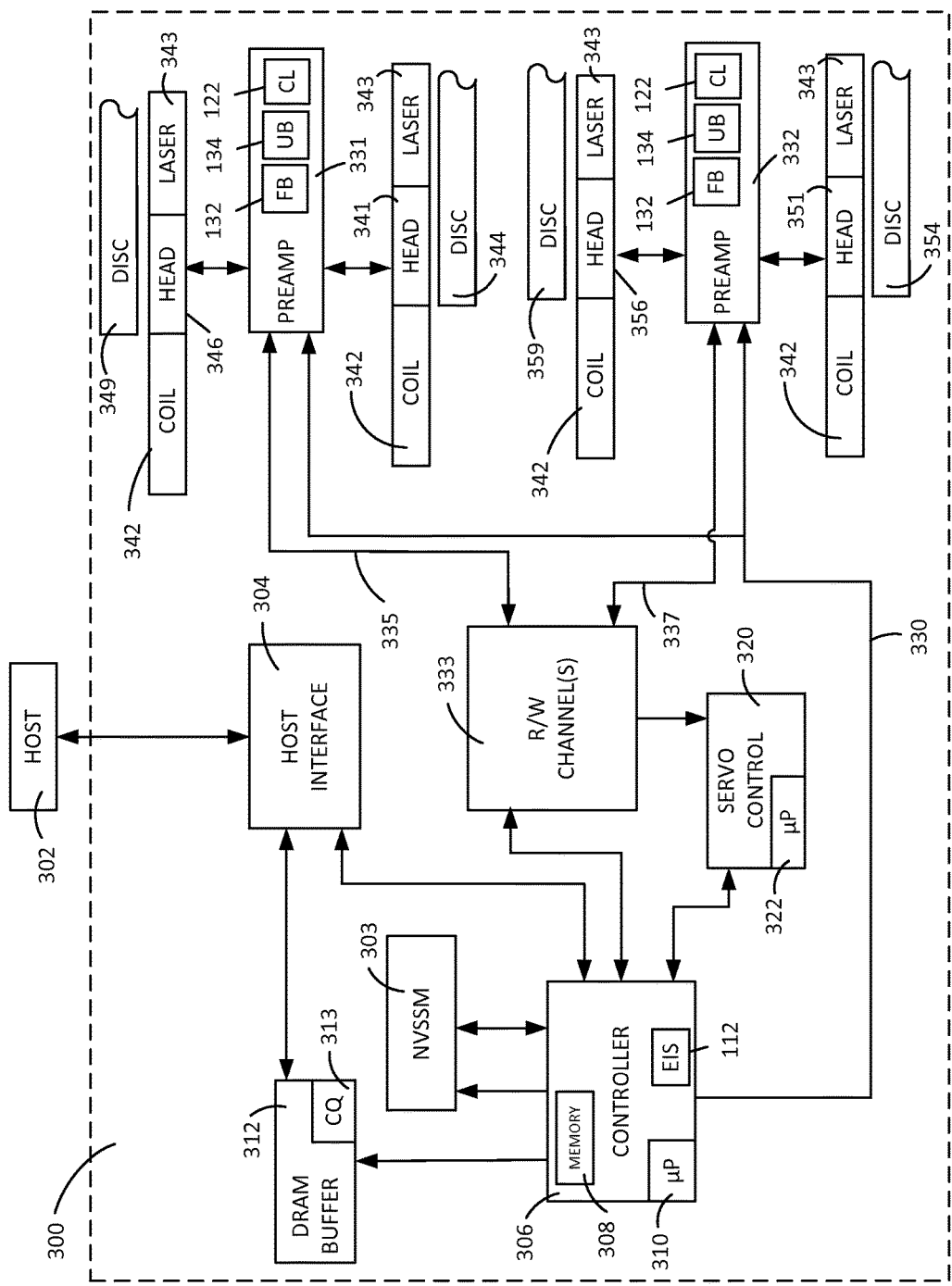
FIG. 3 is a block diagram of a system with multiple individually programmable preamplifiers, in accordance with certain embodiments of the present disclosure.
Figure 5:
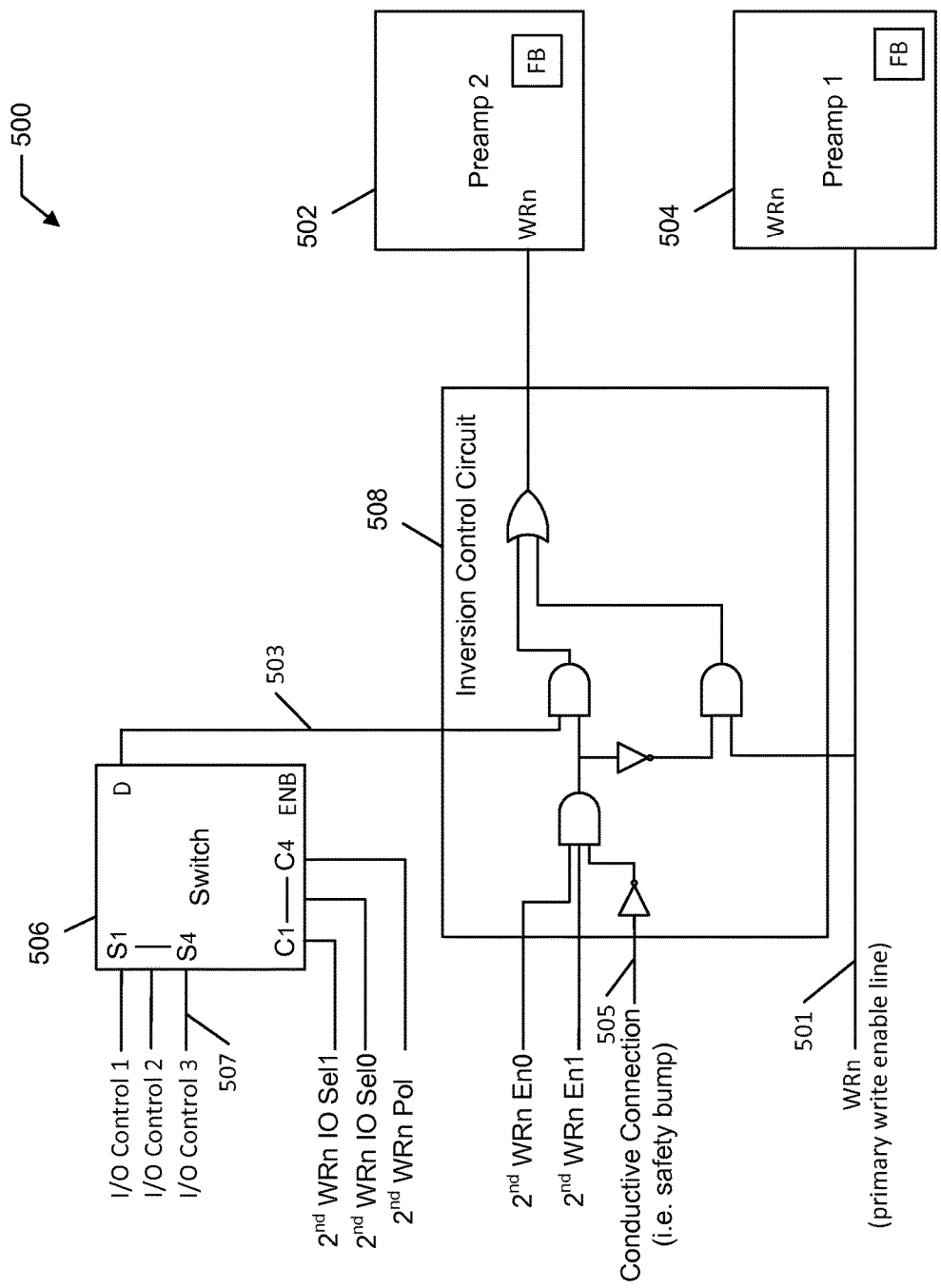
FIG. 5 is a block diagram of a system with multiple individually programmable preamplifiers, in accordance with certain embodiments of the present disclosure.

FIG. 2 is a flowchart of a method 200 to configure preamplifiers over an interface, which may be implemented in conjunction with system 100 of FIG. 1, system 300 of FIG. 3, system 500 of FIG. 5, and the other embodiments described herein, in accordance with certain embodiments of the present disclosure. The preamplifiers may share a common serial interface as shown in FIG. 1, be configured to transition between active and inactive states, and can respond to one or more instructions that can configure the preamplifiers to be individually placed in a static state. For example, the preamplifiers may include a freeze bit and may be responsive to a freeze command which places a preamplifier in a static mode. The preamplifiers may also include an unfreeze bit and the preamplifiers can be responsive to an unfreeze command.

The method 200 may begin, at 201, when a device, such as a controller, a channel, or a logic control circuit determines at least one of multiple preamplifiers should have a different configuration than another of the multiple preamplifiers. Instructions or commands can be sent over a shared interface, such as the serial interface 120, to the multiple preamplifiers to configure the preamplifiers, at 205. The command(s) can include an indication of which preamplifier is associated with the command and the respective preamplifier can becomes active, at 205. The active preamplifier can be placed in a static mode by an instruction setting a freeze bit of the preamplifier to a specific setting, at 215. The static mode can prevent further commands received by the preamplifier from accepting further configuration changes, such as by preventing configurations bits other than an unfreeze bit from being changed.

Conversely, at 205, the preamplifiers which are not associated with the command may not enter an active state and thus may be inactive. The inactive preamplifiers may not be responsive to the freeze command sent over the serial interface, and thus may not enter a static mode. Because these preamplifiers are not in a static mode, these preamplifiers may be configured by programming commands sent over the serial interface.

Subsequent to placing the frozen preamplifier in static mode, further configuration commands can be received by the preamplifiers, at 220, where the further configuration commands do not configure the frozen preamplifier. However, any non-frozen preamplifiers can be configured by the further configuration commands. The distinctly configured preamplifiers can then be operated in accordance with their respective configurations, at 225. An unfreeze command may be received by the preamplifiers, making all preamplifiers (or at least the frozen preamplifier) responsive to configuration commands, at 230. The process may then end, at 231, though the process can repeat for each time a system implementing multiple preamplifiers chooses to configure the settings of one preamplifier different from another preamplifier.

FIG. 3 depicts a block diagram of a system 300 with multiple preamplifiers, according to certain embodiments. FIG. 3 also provides a functional block diagram of a disc drive data storage device (DSD) 300 having multiple preamplifiers 331 and 332. The preamplifiers 331 and 332 may be have a common programming interface bus 330, which can permit programming commands from a control circuit, such as controller 306. Such a system may implement an instruction set and bit(s), such as described herein, to allow a preamplifier to implement a static state and switch to a programmable state, such as described with respect to FIGS. 1, 2, and 4. For example, the control circuit 306 can send a command to the preamplifiers to freeze a selected one of the preamplifiers 331 and 332 such that the frozen preamplifier is no longer responsive to further programming commands. The frozen preamplifier may be unfrozen by an unfreeze command from the control circuit.

The data storage device (DSD) 300 can communicate with a host device 302 via a hardware/firmware based host interface circuit 304 that may include a connector (not shown) that allows the DSD 300 to be physically connected to and removed from the host 302. The buffer 312 can temporarily store user data during read and write operations and can include a command queue (CQ) 313 where multiple pending access operations can be temporarily stored pending execution. A nonvolatile solid state memory 303, such as Flash memory, may be included for additional cache or buffer memory, or to provide additional data storage for the DSD 300.

The DSD 300 can include a programmable controller 306 with associated memory 308 and processor 310. The controller 306 can be coupled to the preamplifiers 331 and 332 by a serial interface 330 such that the preamplifiers 331 and 332 share the same serial interface 330. The controller 306 can issue commands, such as from the enhanced instruction set 112, to the preamplifiers 331 and 332 over the serial interface 330. Each preamplifier 331 and 332 may have a set of bits, including a freeze bit, where a command set of the controller 306 includes a freeze command to place a selected preamplifier in a static state by programming the freeze bit. The set of bits for the preamplifiers 331 and 332 may also include an unfreeze bit that can have the bit(s) therein changed in response to an unfreeze command from the controller 306 to take a frozen preamplifier out of a static mode, which then becomes responsive to further commands from the controller 306.

Further, FIG. 3 shows the DSD 300 can include one or more read/write (R/W) channels 333, with a separate input/output (I/O) of the channel 333 for each of the preamplifiers 331 and 332, I/O 335 and I/O 337, respectively. The channel(s) 333 can encode data during write operations and reconstruct data retrieved from disc(s) during read operations. In some embodiments, each preamplifier 331 and 332 may be associated with one or more data storage mediums (e.g. magnetic discs). For example, preamplifier 331 may be configured to provide write signals to and receive read signals from disc 344 via head 341 and to provide write signals to and receive read signals from disc 349 via head 346. Similarly, preamplifier 332 may be configured to provide write signals to and receive read signals from disc 354 via head 351 and to provide write signals to and receive read signals from disc 359 via head 356. While separate I/O 335 and 337 are depicted, certain embodiments may have a common I/O shared by the preamplifiers 331 and 332 through which data signals and control signals can be sent.

Further, the I/O 335 and 337 (or a common shared I/O) may include multiple control lines and data lines and each preamplifier 331 and 332 may be programmable to utilize a specific control line for multiple functions, each individual line of the I/O coupled to the preamplifier 331 and 332 can by utilized for multiple purposes. These features can be accomplished via programming one or more bit settings, of each individual preamplifier 331 and 332, to control which signal(s) is recognized as received on a specific one of multiple control lines of the I/O 335 or 337 (or a common I/O).

The DSD 300 may also include one or more lasers 343 to perform heat-assisted magnetic recording (HAMR) and may be operably controlled in conjunction with the respective preamp to perform write operations on the disc(s). A servo control circuit 320 may use servo data to provide the appropriate current to coils 342 to position one or more of the heads to a desired location on a disc during execution of various pending commands in the command queue 313.

In certain embodiments, the hardware implementing one or more of the functional blocks of the DSD 300 may be external to a hard drive assembly of the system DSD 300, and may be located on a circuit board either external or internal to a hard drive enclosure (not shown) that includes the discs and the head elements.

Figure 4:
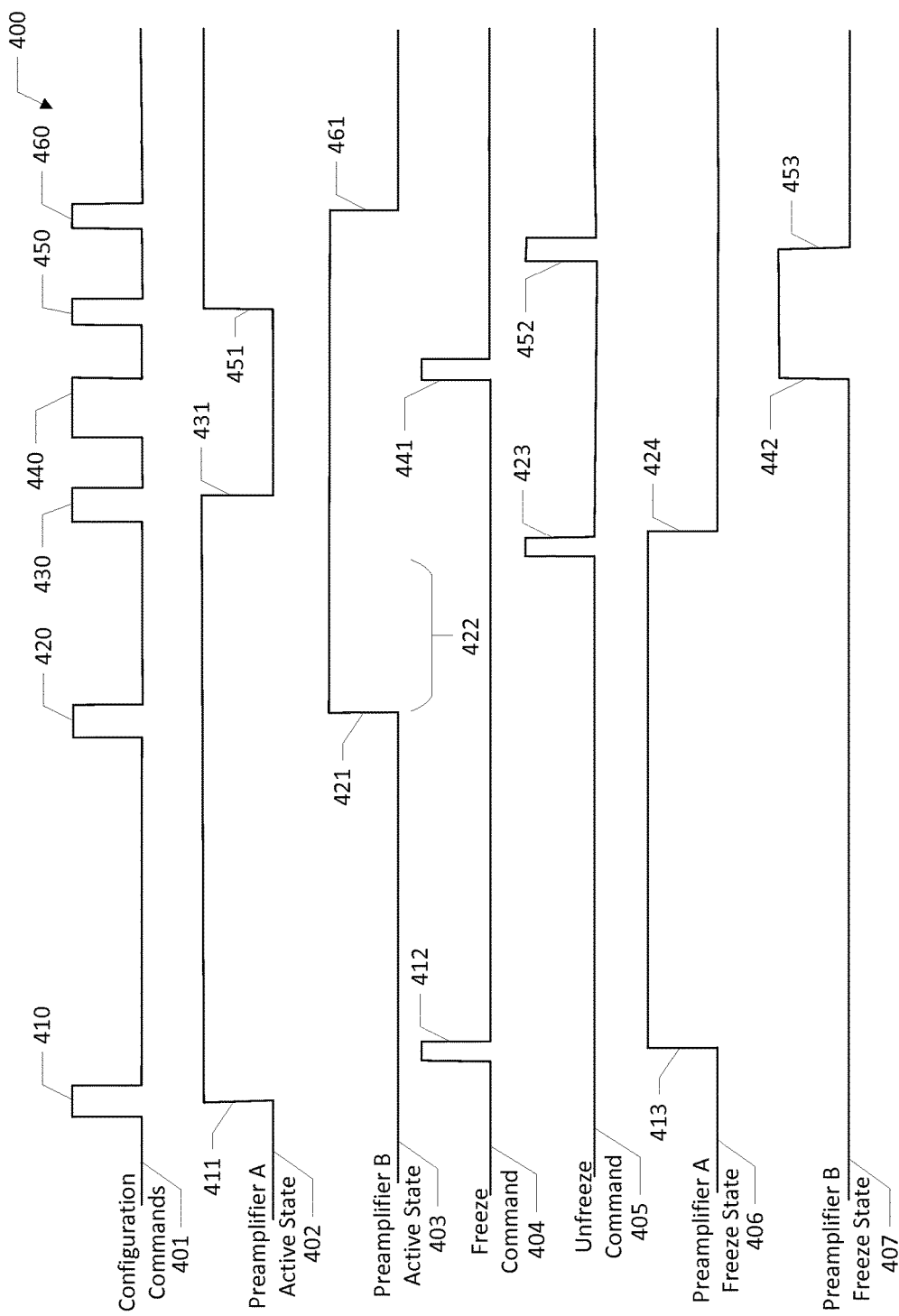
FIG. 4 is a timing and state diagram representing the signals to configure multiple preamplifiers is shown, in accordance with certain embodiments of the present disclosure.

The preamplifiers 331 and 332 may be differentially, individually, and independently programmed over the shared serial interface 330 as described herein, such as described in FIGS. 1, 2, and 4. Different settings of the preamplifiers 331 and 332 can allow the DSD 300 to read and write simultaneously (i.e. at the same time) using both preamplifiers 331 and 332 where one of the preamplifiers is configured to read data and the other preamplifier is configured to write data. In a multiple preamplifier system 300, the preamplifiers 331 and 332 can be differently and individually configured over a single interface 330. The preamplifiers 331 and 332 may be released from the static state (frozen) by either programming the unfreeze bit (which can release all of the preamps) or by programming the freeze bit to a "0" state (releases the individual preamp).

The serial interface 330 may include a clock line, a data line, and a data control line. In certain embodiments, the preamplifiers 331 and 332 can share a common read/write control (335, 337) such that both of the preamplifiers 331 and 332 read at the same time or write at the same time responsive to the common read/write control.

In some embodiments, to read data via one preamplifier at the same time as writing data via the other preamplifier, the set of bits in each preamplifier may include an inversion bit corresponding to the read/write control. The controller 306 can configure the setting of the inversion bits during the configuration of the preamplifier by configuration commands. When a respective inversion bit is set (i.e. programmed with a specific value), the signal of the read/write control line will be inverted. The inversion bits of the preamplifiers 331 and 332 may be individually set for each preamplifier, allowing preamplifiers to be individually configured to read or write data responsive to the read/write control 430. In some embodiments with read/write line inversion, it may be possible to perform a flaw scan with one head element while performing a read or write operation with another head element.

Referring to FIG. 4, a timing and state diagram 400 for configuring two preamplifiers is shown, in accordance with certain embodiments of the present disclosure. The two preamplifiers, preamplifier A and preamplifier B, may be part of a multiple-preamplifier system similar to the systems described herein, in which the preamplifiers A and B share a common serial interface.

The timing and state diagram 400 includes a timing diagram 401 of configuration commands 401 sent over the serial interface to the preamplifiers A and B, a state diagram 402 of the preamplifier A, a state diagram 403 of the preamplifier B, a freeze command timing diagram 404 indicating freeze commands sent over the serial interface to the preamplifiers A and B, an unfreeze command timing diagram 405 indicating unfreeze commands sent over the serial interface to the preamplifiers A and B, a state diagram 406 of the freeze state of preamplifier A, and a state diagram 407 of the freeze state of preamplifier B.

With regard to the configuration commands 401, a command 410 indicating a selected component of preamplifier A may be sent over the serial interface to the preamplifiers A and B. Because the selected component may be coupled to preamplifier A, the command 410 can put the preamplifier A into the active state, as indicated at 411 of the preamplifier A state diagram 402. Meanwhile, the preamplifier B may be in an inactive state, as indicated by the preamplifier B state diagram 403. Subsequent to the preamplifier A being put in the active state at 411, a freeze command 412 may be sent over the serial interface to the preamplifiers A and B, as shown by the freeze command timing diagram 404. Responsive to the freeze command 412, the preamplifier A can enter a freeze state, as indicated at 413 of the preamplifier A freeze state diagram 406. Thus at 413, the configuration of the preamplifier A may be non-programmable during the freeze state. After entering the freeze state at 413, the preamplifier A may be responsive only to subsequent freeze or unfreeze commands.

Subsequent to the preamplifier A being put in a freeze state at 413, a command 420 indicating an element associated with preamplifier B may be sent over the serial interface to the preamplifiers A and B. Because the element is associated with preamplifier B, preamplifier B can enter an active state, as indicated at 421. Both the preamplifiers A and B may read or write according to their respective configurations subsequent to the head select command 420 being implemented at 421 for the duration 422. The duration 422 may be ended by an unfreeze command 423, which can cause the preamplifier A to be unfrozen as indicated at 424. Thus, subsequent to 424, both of the preamplifiers A and B may be responsive to configuration commands sent over the serial interface. Both of the preamplifiers A and B may also be in the active state at 424.

Subsequent to the unfreeze command 423 taking the preamplifier A out of the frozen state at 424, a configuration command 430 may be sent over the serial interface to the preamplifiers A and B, as shown by the configuration commands 401. The configuration command 430 may indicate a component associated with preamplifier B, thus maintaining the active state of the preamplifier B. However, preamplifier A can exit the active state and enter the inactive state because the configuration command 430 is not associated with the preamplifier A, as shown at 431.

Subsequent to the configuration command 430, configuration command 440 may be sent over the serial interface to the preamplifiers A and B. The further configuration commands 440 may configure the configuration bit settings of the preamplifiers A and B. Then, a freeze command 441 may be sent over the serial interface to the preamplifiers A and B. Because the preamplifier A is not in the active state, the configuration of the preamplifier A may not be frozen. Because the preamplifier B is in the active state, the configuration of the preamplifier B (as configured per the configuration command 440) may be frozen by the reception of the freeze command 441 at the preamplifier B, as indicated at 442.

Subsequent to the freeze command 441, a configuration command 450 may be sent over the serial interface to the preamplifiers A and B. The configuration command 450 may indicate a component associated with preamplifier A, thus causing preamplifier A to become active, as indicated at 451. Subsequent to the preamplifier A becoming active at 451, an unfreeze command 452 may be sent over the serial interface to the preamplifiers A and B. Reception of the unfreeze command at the preamplifier B may cause the preamplifier B to exit the frozen state and enter the unfrozen state, as indicated at 453. Thus, subsequent to 453, both of the preamplifiers A and B may be responsive to configuration commands sent over the serial interface.

Further, subsequent to 453, a configuration command 460 may be sent over the serial interface to the preamplifiers A and B. The configuration command 460 may indicate a component specifically associated with preamplifier A, and thus the preamplifier A can remain in the active state. This can also cause preamplifier B to exit the active state and enter the inactive state, as indicated by 461.

Referring to FIG. 5, a block diagram of a system 500 with multiple individually programmable preamplifiers is shown, in accordance with certain embodiments of the present disclosure. System 500 may be implemented in conjunction with system 100 of FIG. 1, system 300 of FIG. 3, and any of the other embodiments described herein. System 500 may include a first individually programmable preamplifier 502, a second individually programmable preamplifier 504, a switch 506, and a control circuit 508.

In certain embodiments, the system 500 may be implemented in conjunction with an inversion feature (such as inversion bit 141), as described herein. Which, for example, can allow a data storage device to read data via one preamplifier at the same time as writing data via the other preamplifier. When an inversion feature is activated, the signal of the read/write control line will be inverted. For example, the inversion feature may be implemented via two bits in separate registers, where setting of both bits can be required to enable the inversion feature.

When the inversion feature is enabled in system 500, the preamplifier 502 switches its write enable (WRn) control 501 to the secondary control line (WRn2) 503. In certain embodiments, this can be accomplished by programming a first bit ($2^{nd}$ WRn En0) of a first register and a second bit of a second register ($2^{nd}$ WRn En1) when a physical conductive connection 505 (e.g. a solder bump) is connected to a pre-determined setting, such as a logic high value.

Table 1 includes the logic associations of the inputs to control circuit 508 to enable or disable the inversion feature, in accordance with certain embodiments of the present disclosure.

TABLE 1

Enabling Secondary Write Enable Line

| Inversion Control Line via Conductive Connection ($2^{nd}$ WRn En) | $2^{nd}$ WRn En1 (e.g. Register 1, D6) | $2^{nd}$ WRn En0 (e.g. Register 2, D6) | Secondary WRn control Inversion-Feature Status |
|---|---|---|---|
| 1 | X | X | Disabled |
| 0 | 0 | 0 | Disabled |
| 0 | 0 | 1 | Disabled |
| 0 | 1 | 0 | Disabled |
| 0 | 1 | 1 | Enabled, Secondary WRn control is used |

In some embodiments, a physical conductive connection (e.g. a solder bump) on the preamplifier may be required to allow or deny an inversion bit from being effective. The physical conductive connection can provide a physical safety mechanism to disable the inversion feature. For example, the physical conductive connection can be made between a specific input (i.e. the inversion safety control line 505) of a preamplifier control circuit 508; whether the inversion bit feature is enabled can depend on whether the inversion control line was connected to a proper polarity voltage, which, when enabled, would allow the inversion bit to allow polarity switching. Thus, before a preamplifier can use the inversion switching feature set, the physical conductive connection must be properly set to allow such. In some examples, the inversion control line can be connected to a logic high input (e.g. greater than 3 volts) for the inversion circuit 508 to be activated, which allows the inversion bits to be utilized; whereas, if the inversion safety control line 505 is connected to a logic low input (e.g. less than 1 volt), the allowance circuit 508 is not activated and inputs to the inversion bits (e.g. $2^{nd}$ WRn En1 and 2nd WRn En0) are not determinative of whether the secondary control line (WRn2) 503 is provided to the preamp 502 (e.g. see Table 1).

While the system 500 can be utilized without the inversion safety control line 505 and conductive connection, such provides an extra safety feature to disable the inversion feature in architectures that do not need the inversion feature. Further, such a safety control line 505 could be used to physically enable or disable other features of a preamplifier (or other circuit). Yet even further, such a safety feature may be implemented in systems with a single preamplifier to disable a feature to implement a first state of the preamplifier and enable the feature to implement a second, different state of the preamplifier.

As described herein, a preamplifier system, such as system 500, can select and program specific I/O lines to be used for specific tasks. For example, in system 500, switch 506 can have one or more registers (e.g. 2nd WRn IO Sel1 and 2nd WRn IO Sel0) that can be programmed to be provide a specific output 503. In some embodiments, such as system 500, the switch 506 can be used to implement a control to select which preamplifier IO line to use as the secondary control line inversion-feature, which must be enabled as discussed above in order for the control bits to have any effect.

Table 2 includes the logic associations of the inputs to switch 506 to select which preamplifier IO line to use as the secondary control line inversion-feature, in accordance with certain embodiments of the present disclosure.

TABLE 1

Selecting Secondary Write Enable Line

| $2^{nd}$ WRn IO Sel1 Sel1 Reg. 1, D5 | $2^{nd}$ WRn IO Sel0 Sel0 Reg. 1, 6 | $2^{nd}$ Write Enable Control Line |
|---|---|---|
| 0 | 0 | IO Control 1 |
| 0 | 1 | IO Control 2 |
| 1 | 0 | IO Control 3 |
| 1 | 1 | IO Control 4 |

In some embodiments of system 500, a polarity of a register (e.g. $2^{nd}$ WRn Pol) can select (i.e. be determinative) of the polarity of the specific output 503. For example, $2^{nd}$ WRn Pol may be programmed with either a logic high or a logic low to determine the polarity of the output 503, such that when $2^{nd}$ WRn Pol is a logic low (e.g. 0), a logic high on the output 503 indicates a write and a logic low indicates a read; conversely, when $2^{nd}$ WRn Pol is a logic high (e.g. 1), a logic low on the output 503 indicates a write and a logic high indicates a read.

The system 500 may be included in a preamplifier die or as separate circuits on a substrate or flex. The switch 506 and the control circuit 508 may receive the control signals and the I/O signals from a controller, data channel, or combination thereof, such as described with respect to logical element 110 of FIG. 1, controller 306 of FIG. 3, or data channel 333 of FIG. 3.

In certain embodiments of systems and methods described herein, multiple preamplifiers can be used simultaneously. In some cases, as previously mentioned, a system may be configured to read data via one preamplifier as it writes data via another preamplifier. Further, multiple preamplifiers may be configured as described herein to write (i.e. store) data simultaneously or read (i.e. retrieve) data simultaneously. For example, in a data storage system having a single channel coupled to multiple preamplifiers, a data storage system can write data with two different write streams by multiplexing write data on a read line over a shared bus. For example, a write line may carry one write signal to a first preamplifier while a read line may carry the second write signal to a second or nth preamplifier. Similarly, a system can be configured to read data utilizing two different read signals by multiplexing a read data flow on a write line. For example, one preamplifier may utilize a read line while a further preamplifier may use a write line or a pattern dependent write line.

In embodiments of systems configured or arranged to read and write with different preamplifiers at the same time, the timing of the write gate of a writing preamplifier versus the read gate of the reading preamplifier may be skewed, or vice versa. The skewing of the write and read gates relative to each other can allow the system to adjust the actual write gate timing of the writing preamplifier to not destroy servo fields, by over-writing, for example. The timing skew can be accomplished by an additional hardware line associated with additional hardware line control modes that allows for an AND logic effect of controls to trigger the write mode, or may be accomplished by a programmable time that allows for delay of the write mode from the read/write line transition.

While many of the embodiments described herein discuss multiple (two or more) preamplifier systems, this disclosure also covers a single preamplifier having a freeze bit, as multiple preamplifiers are not required for an individual preamplifier to implement a static state. There may be other uses for such preamplifiers, or amplifiers, that include a static state. For example, a device may implement such to provide extra security to prevent tampering with register/bit settings.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
    a first preamplifier having a first set of bits, including a first freeze bit stored in a register of the first preamplifier that, when set, causes the first preamplifier to enter a static state that prevents one or more other bits of the first set of bits from being changed when subsequent commands are received at the first preamplifier.

2. The apparatus of claim 1, further comprising:
    a second preamplifier having a second set of bits including a second freeze bit that, when set, causes the second preamplifier to enter a static state that prevents one or more other bits of the second set of bits from being changed when subsequent commands are received at the second preamplifier; and
    a serial interface bus coupled to both the first preamplifier and the second preamplifier, the serial interface bus configured to deliver programming commands to both the first preamplifier and the second preamplifier.

3. The apparatus of claim 2, further comprising:
    the first preamplifier includes a first data input/output line adapted to couple to a digital data channel; and
    the second preamplifier includes a second data input/output line adapted to couple to a digital data channel, the second input/output line separate from the first input/output line and each separate from the serial interface bus.

4. The apparatus of claim 2 further comprising:

a control circuit coupled to the serial interface bus, the control circuit including an instruction set executable by a processor to send programming commands to both the first preamplifier and the second preamplifier; and the instruction set including a freeze command that, when received by a preamplifier, sets a corresponding freeze bit to a setting that initiates the static state.

5. The apparatus of claim 4, further comprising:

the first preamplifier and second preamplifier are independently configured to transition between an active state and an inactive state, where a corresponding preamplifier is responsive to a freeze command when in the active state and is not responsive to a freeze command when in the inactive state;

the first preamplifier configured to enter the active state when a first command indicating a first component to be utilized that is associated with the first preamplifier is received at the first preamplifier;

the second preamplifier configured to enter the active state when a second command indicating a second component to be utilized that is associated with the second preamplifier is received at the second preamplifier; and the first preamplifier configured to transition to the inactive state upon receiving the second command when the first preamplifier is in the active state and is not in the static state.

6. The apparatus of claim 4, further comprising:

a control line coupled to the first preamplifier, the second preamplifier, and the control circuit, the control line driven by the control circuit; and the first preamplifier includes an inversion bit that when set, causes the first preamplifier to invert a signal received via the control line thereby changing a function of the first preamplifier based on the control line.

7. The apparatus of claim 1 further comprising the first preamplifier having an unfreeze bit that when set causes the first preamplifier to exit the static state.

8. The apparatus of claim 1 further comprising the first preamplifier configured to transition between an active state and an inactive state, where the first preamplifier is responsive to a freeze command to set the first freeze bit when in the active state and is not responsive to the freeze command when in the inactive state.

9. The apparatus of claim 1 further comprising:

an inversion control circuit configured to receive a control signal for the first preamplifier, selectively invert the control signal, provide an inverted control signal to the first preamplifier when the control signal is inverted, and provide a non-inverted control signal to the first preamplifier when the control signal is not inverted; and a switch circuit configured to receive an inversion control signal to program an inversion control bit that, when in a first setting, causes the inversion control circuit to invert the control signal received at a first control input.

10. The apparatus of claim 1 further comprising an inversion control circuit configured to receive a control signal for the first preamplifier, selectively invert the control signal, and selectively provide one of an inverted control signal and a non-inverted control signal to the first preamplifier; and a physical conductive connection coupled to a control line of the inversion control circuit, where the inversion control circuit is disabled from inverting the control signal in a first state and enabled to invert the control signal in a second state, the first state implemented when the physical conductive connection couples the control line to a first voltage line, and the second state implemented when the physical conductive connection couples the control line to a second voltage line configured to provide a different voltage than the first voltage line.

11. A system comprising:

a first preamplifier having a first set of bits including a first freeze bit that when set causes the first preamplifier to enter a static state that prevents one or more other bits of the first set of bits from being changed when subsequent commands are received at the first preamplifier;

a second preamplifier having a second set of bits; and an interface bus coupled to the first preamplifier and the second preamplifier, the interface bus configured to deliver a bit programming command to both the first preamplifier and the second preamplifier.

12. The system of claim 11 further comprising:

a control circuit coupled to the interface bus, the control circuit including an instruction set executable by a processor to send the bit programming command to both the first preamplifier and the second preamplifier; and the instruction set including a freeze command that, when received by the first preamplifier, sets the first freeze bit to cause the first preamplifier to enter the static state.

13. The system of claim 11 further comprising the second preamplifier including a second freeze bit that, when set, causes the second preamplifier to enter a static state that prevents one or more other bits of the second set of bits from being changed when a subsequent command is received at the second preamplifier.

14. The system of claim 13, further comprising:

the first preamplifier and second preamplifier are independently configured to transition between an active state and an inactive state, where a corresponding preamplifier is responsive to a freeze command when in the active state and is not responsive to a freeze command when in the inactive state;

the first preamplifier configured to enter the active state when a first command indicating a first component to be utilized that is associated with the first preamplifier is received at the first preamplifier; and the second preamplifier configured to enter the active state when a second command indicating a second component to be utilized that is associated with the second preamplifier is received at the second preamplifier.

15. The system of claim 11, further comprising:

one or more first data storage components coupled to the first preamplifier;

one or more second data storage components coupled to the second preamplifier;

the first preamplifier and second preamplifier are independently configured to transition between an active state and an inactive state, where a corresponding preamplifier is responsive to a freeze command when in the active state and is not responsive to a freeze command when in the inactive state the first preamplifier configured to implement the active state based on receiving a command associated with the one or more first data storage elements; and the second preamplifier configured to implement the active state based on receiving a command associated with the one or more second data storage elements.

16. A memory device storing instructions, that when executed cause a control circuit to:

send a freeze command to a first amplifier, the freeze command configured to program a freeze bit of the first amplifier to a first setting that causes the first amplifier to enter a static state which prevents the first amplifier from implementing amplifier programming commands except for a command that takes the first amplifier out of the static state, by preventing other programmable bits of the first amplifier from being changed when subsequent commands are received at the first amplifier.

17. The memory device of claim 16 storing further instructions, that when executed cause a control circuit to:
send a command to the first amplifier to put the first amplifier into an active state from an inactive state, where the first amplifier is not responsive to the freeze command when the first amplifier is in the inactive state.

18. The memory device of claim 16 storing further instructions, that when executed cause a control circuit to:
send an unfreeze command to the first amplifier, the unfreeze command configured to program an unfreeze bit to a first setting that causes the amplifier to exit the static state, which allows the other programmable bits of the first amplifier to be changed when subsequent commands are received at the first amplifier.

19. The memory device of claim 16 storing further instructions, that when executed cause a control circuit to:
send a freeze command to a second amplifier, the freeze command configured to program a freeze bit to a first setting that causes the second amplifier to enter a static state to prevent other programmable bits of the second amplifier from being changed when subsequent commands are received at the second amplifier.

20. The memory device of claim 16 storing further instructions, that when executed cause a control circuit to:
send a programming command to the first amplifier and a second amplifier when the first amplifier is in the static state and the second amplifier is not in the static state, the programming command including instructions to change one or more bit settings of the other programmable bits.

\* \* \* \* \*